United States Patent [19]
Rha et al.

[11] Patent Number: 5,387,531
[45] Date of Patent: Feb. 7, 1995

[54] HOLE CAPACITOR FOR DRAM CELL AND A FABRICATION METHOD THEREOF

[75] Inventors: Sa K. Rha; Dong W. Kim, both of Seoul, Rep. of Korea

[73] Assignee: Gold Star Electron Co., Ltd., Chungcheongbuk, Rep. of Korea

[21] Appl. No.: 942,228

[22] Filed: Sep. 9, 1992

[30] Foreign Application Priority Data

Sep. 9, 1991 [KR] Rep. of Korea .................. 91-15725

[51] Int. Cl.[6] ........................................... H01L 21/70
[52] U.S. Cl. .......................................... 437/52; 437/60; 437/233; 437/919; 437/977
[58] Field of Search ................ 437/47, 48, 52, 60, 437/233, 919, 977; 257/309; 361/311

[56] References Cited

U.S. PATENT DOCUMENTS

| | | | |
|---|---|---|---|
| 5,149,676 | 9/1992 | Kim et al. | 437/977 |
| 5,192,702 | 3/1993 | Tsemg | 437/47 |
| 5,204,280 | 4/1993 | Dhong et al. | 437/52 |
| 5,254,503 | 10/1993 | Kenney | 437/977 |
| 5,256,587 | 10/1993 | Jum et al. | 437/52 |

Primary Examiner—Tom Thomas

[57] ABSTRACT

A method for making a hole capacitor for DRAM cell includes the steps of: depositing a nitride layer and a lower oxide layer, and forming a buried contact hole, after forming a MOS transistor upon a semiconductor substrate. Thereafter depositing an in-situ doped non-crystalline silicon layer, an undoped non-crystalline silicon layer, and a hemispherical polysilicon layer in all in sequence with a thickness of 1500 Å or over. An upper oxide film is deposited, and then, carrying out an etch-back on the upper oxide film so that the hemispherical polysilicon domes are exposed. Etching the polysilicon layers using the remained portions of the upper oxide film remaining on the valleys of the hemispherical polysilicon as a mask, in order to form a plurality of holes perforated from the domes to the insulating layer located under the layers. The upper oxide film is removed through an etch process. Patterning a lower electrode of the capacitor, etching the lower oxide film, forming a dielectric layer on the surface of the lower electrode, and forming an upper electrode in match with the lower electrode across the dielectric layer.

4 Claims, 3 Drawing Sheets

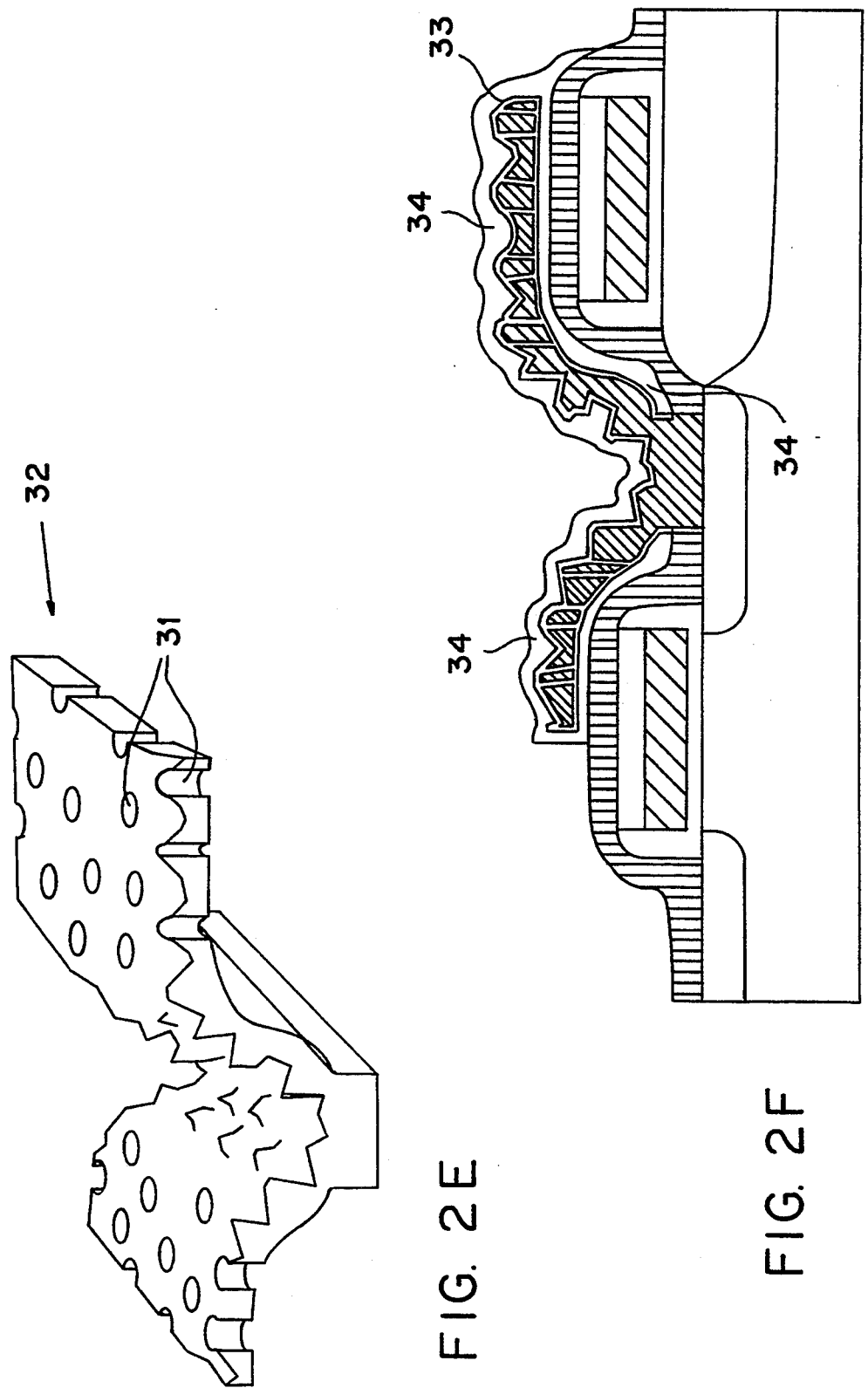

HOLE CAPACITOR FOR DRAM CELL AND A FABRICATION METHOD THEREOF

FIELD OF THE INVENTION

The present invention relates to a hole capacitor for a DRAM cell and a method for its fabrication, and particularly to a capacitor and a fabrication method, in which holes are formed in a capacitor electrodes to be suitable for a high density device such as 64M DRAM.

BACKGROUND OF THE INVENTION

The conventional DRAM memory cells for storing information have stack capacitors or trench capacitors. In the case of a stack capacitor, a high stack structure has to be built in a narrower space in order to obtain a capacitance sufficient for a high density device, with the result that the step coverage is not smooth. Meanwhile, in the case of trench capacitor, the isolation between trenches becomes insufficient, and the manufacturing process are complicated.

The method for fabrication of a conventional stack capacitor cell will be briefly described below.

As shown in FIG. 1A, first a MOS transistor fabrication process is carried out by forming a field oxide 2 for isolating active regions, a gate electrode 3 and a source/drain region 4 upon a semiconductor substrate 1, and then, an insulating layer 5 is formed thereupon.

Then a polysilicon 6 is deposited over entire wafer so as for it to serve as a lower electrode of the stack capacitor, and then, a buried contact hole 71 is formed by applying a process of photolithography (photo-etching process) using a photoresist 7, as shown in the FIG. 1B.

Then the photoresist 7 is removed, and a polysilicon 8 is deposited to serve as a lower node ( storage electrode) of the stack capacitor. Then a contact 10 is formed, and a lower storage node of a stack capacitor is patterned by applying a photolithography and etching process using a photoresist 9, as shown in the FIG. 1C.

Then The photoresist is removed, a high dielectric material 11 (O—N—O, N—O or the like) is coated, a polysilicon is deposited over entire wafer, and a plate electrode 12 (upper electrode) of the stack capacitor is formed.

In the conventional technique as described above, the capacitance of the stack capacitor is not sufficient for a high density DRAM cell (e.g., 64M). Meanwhile, in the case where a fin structure or a cylindrical structure is adopted in order to increase the capacitance, the step coverage becomes worse, thereby inviting difficulty in carrying out the next step.

SUMMARY OF THE INVENTION

The present invention is intended to overcome the above described disadvantages of the conventional techniques.

Therefore it is the object of the present invention to provide a hole capacitor and a method for fabrication thereof, in which a plurality of holes are formed in the lower electrode of the stack capacitor, thereby increasing the capacitance.

A hole capacitor of present invention for storing charges in DRAM cell has a lower electrode having a plurality of holes and projections, a dielectric layer coated on the surface of the lower electrode, and an upper electrode formed in match with the lower electrode across the dielectric layer.

A method of present invention for making a hole capacitor for DRAM cell comprises the steps of: depositing a nitride layer and a lower oxide layer, and forming a buried contact hole, after forming a MOS transistor upon a semiconductor substrate; depositing an in-situ doped non-crystalline silicon layer, an undoped non-crystalline silicon layer, and a hemispherical polysilicon layer in the cited order all in a thickness of 1500 Å or over; depositing an upper oxide film, and then, carrying out an etch-back on the upper oxide film so as for the hemispherical polysilicon domes to be exposed; etching the polysilicon layers using the remained portions of the upper oxide film remaining on the valleys of the hemispherical polysilicon as a mask, in order to form a plurality of holes perforated from the domes to the insulating layer located under the layers; removing the upper oxide film through an etch process, patterning a lower electrode of the capacitor, etching the lower oxide film, forming a dielectric layer on the surface of the lower electrode, and forming an upper electrode in match with the lower electrode across the dielectric layer.

The hemispherical polysilicon layer is formed by applying a pressure of 0.1 to 1 torr at a temperature of 570° to 585° C. under an atmosphere of $SiH_4$ or $Si_2H_6$ gas.

Preferably, the thickness of the lower electrode of the capacitor is larger than the diameter of the holes.

BRIEF DESCRIPTION OF THE DRAWINGS

The above object and other advantages of the present invention will become more apparent by describing in detail the preferred embodiment of the present invention with reference to the attached drawings in which:

FIG. 2E illustrates capacitor electrode of the present invention; and

FIG. 2F illustrates the capacitor electrode of FIG. 2E combined in an IC.

DESCRIPTION OF THE PREFERRED EMBODIMENT

In the following description only the principal stages involved will be specifically mentioned. Thus the various washing, cleaning, baking, annealing, etc. in fabrication process, will not, for the sake of brevity, be separately considered unless any such stage has an especial significance other than a conventional or standard purpose.

In this invention the conventional known IC fabrication technologies such as starting material processes, imaging processes, deposition and growth processes, etching and masking processes, selective diffusion, the silicon gate process, ion implantation processes, etc. are used for fabrication process as it is unless it is specially mentioned.

Figure 1A:
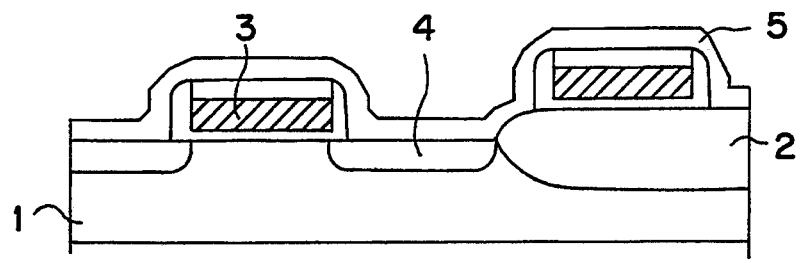
FIGS. 1A to D illustrates the method for fabrication of the conventional stack capacitor cell.
Figure 1B:
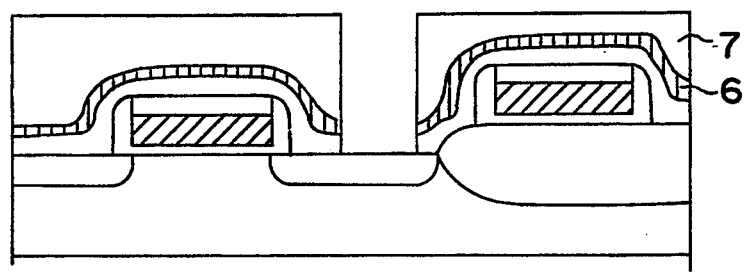
Figure 1C:
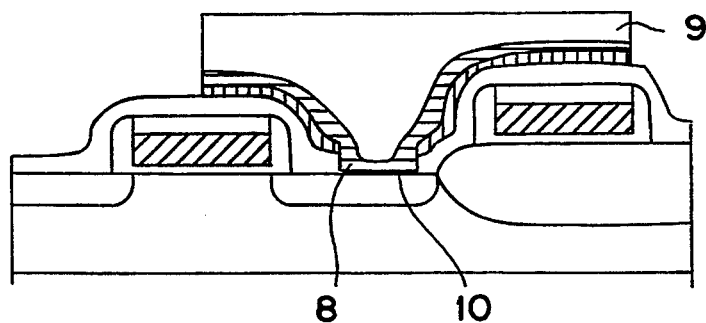
Figure 1D:
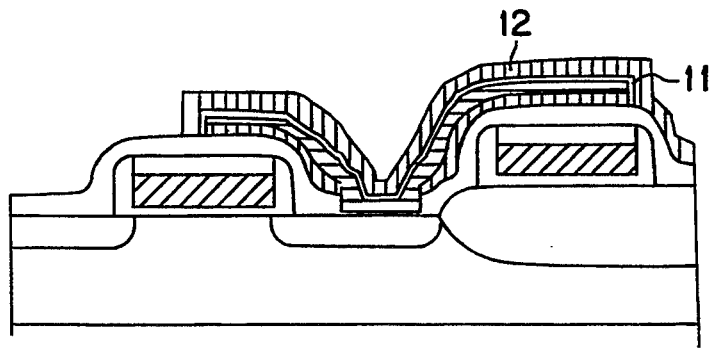
Figure 2A:
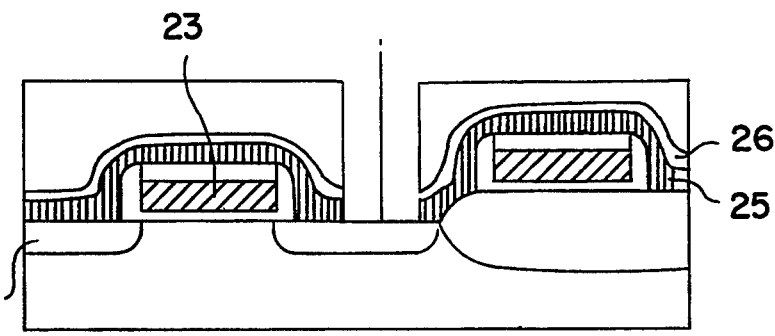
FIGS. 2A to D illustrates the method for fabrication of the hole capacitor for DRAM cell according to the present invention.

As shown in FIG. 2A, at first a transistor in an active region of semiconductor wafer is formed based by a conventional semiconductor fabrication technique by forming a source/drain region 24 and a gate electrode 23. Then, in order to isolate the stack capacitor from the already formed conductive layers, an insulating layers such as a nitride film 25, a lower oxide film (HTO film) 26, or an oxide film, a nitride film and a lower oxide film are formed in the cited order. Then the wafer is entirely covered with a photoresist 27, and a contact hole 71 is opened at a portion where a buried contact is to be formed by applying a photolithography and etching process.

Then the photoresist 27 is removed, and there are deposited an in-situ doped non-crystalline silicon film, an undoped non-crystalline silicon film 28, and a hemispherical polysilicon layer over the entire wafer with all with a thickness of 1500 Å or over.

At this step, the hemispherical polysilicon layer is formed by applying a pressure of 0.1-1 torr at a temperature of 570°-585° C. under an atmosphere of $SiH_4$ or $Si_2H_6$ gas so as for the layer to form an under-hemispherical face with many domes.

Figure 2B:
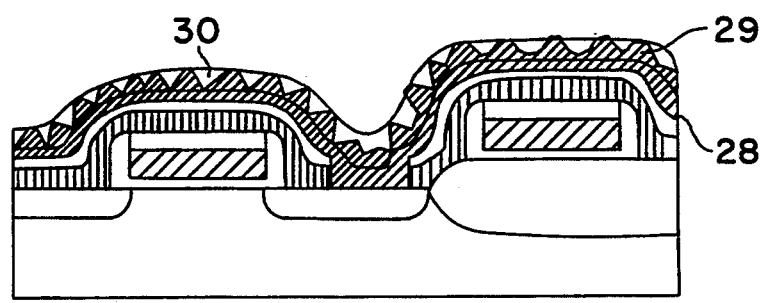

Then an upper oxide film 30 is formed by depositing an HTO (or HLD, LTO or the like), and etched back out so as for peaks of the hemispherical domes to be exposed as shown in the FIG. 2B.

Figure 2C:
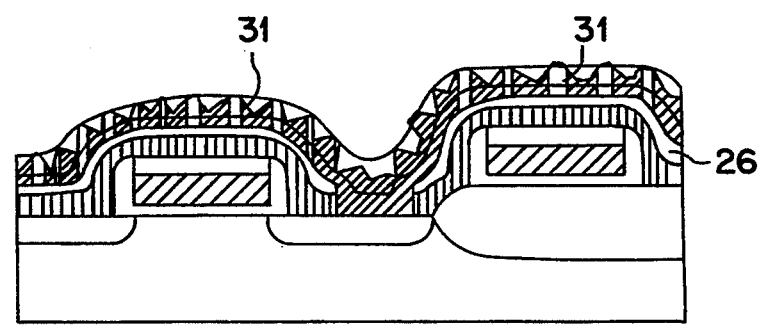

Thereafter, the polysilicon layers of the in-situ doped non-crystalline silicon film, the undoped non-crystalline silicon film 28, and the hemispherical polysilicon layer are etched by using the remained portions of said upper oxide film remaining on the valleys of said hemispherical polysilicon as a mask, in order to form a plurality of holes perforated from the peaks of the domes to the lower oxide layer 26 as shown in FIG. 2C.

Here, the thickness of the polysilicon layers, which is to become the lower electrode(storage electrode) of the capacitor, is made larger than the diameter of the holes.

Figure 2D:
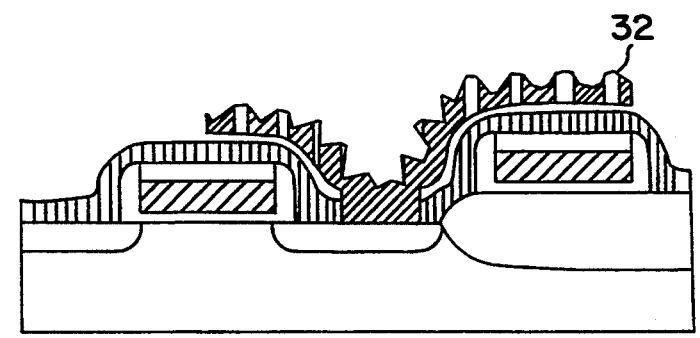

In next step, the upper oxide layer 30 that is remaining on the valleys of the hemispherical polysilicon is removed, and a photo-etching process is carried out to form a lower electrode 32 of the capacitor, while the lower oxide layer 26 that is located under the lower electrode 32 is also removed (refer to FIG. 2D).

Through the above described process, the lower electrode of the stack capacitor, i.e., the storage electrode 32 of the hole capacitor is formed, and this portion is illustrated in FIG. 2E in a perspective view. The recessed portion of the lower electrode, under which a contact with the source/drain is formed by filling the contact hole, is not provided with holes, and the hemispherical surface remains as it was.

A dielectric layer 33 (O—N—O, N—O, $Ta_2O_5$ or the like) is coated(deposited) on the surface of the lower electrode of the capacitor, and an upper electrode of the capacitor is formed using polysilicon, thereby a hole capacitor is made. Element 34 in FIG. 2F is a conducting material.

The rest of the process is carried out in the same manner as that of the conventional DRAM fabrication process.

In the hole capacitor manufactured in the above described manner, large numbers of dome shaped projections and holes are formed between the two electrodes, and therefore, the areas of the mutually facing surfaces are maximized, thereby drastically increasing the capacitance of this hole capacitor.

Thus, the capacitor of the present invention can be usefully applied to semiconductor memories for storing information.

What is claimed is:

1. A method for making a hole capacitor for DRAM cell, comprising the steps of:
   (a) depositing an insulating layer, and opening a buried contact hole in said insulating layer, after forming a MOS transistor upon a semiconductor substrate;
   (b) sequentially depositing an in-situ doped non-crystalline silicon layer, an undoped non-crystalline silicon layer, and a hemispherical polysilicon layer with a plurality of domes, each having a thickness of at least 1500 Å;
   (c) depositing an upper oxide layer, and etching back the upper oxide layer until peaks of the hemispherical polysilicon domes are exposed;
   (d) etching said silicon layers and said polysilicon layer by using portions of said upper oxide layer remaining on the valleys of the hemispherical polysilicon domes as a mask, in order to form a plurality of holes perforated from the peaks of the domes to said insulating layer;
   (e) removing said upper oxide layer, patterning said silicon layers and said polysilicon layer to form a lower electrode of the capacitor, and etching said insulating layer; and
   (f) coating a dielectric layer on the surface of the lower electrode, and forming an upper electrode in match with said lower electrode on said dielectric layer.

2. The method as claimed in claim 1, wherein the hemispherical polysilicon layer is formed by applying pressure of 0.1 to 1 torr, at a temperature of 570° to 585° C. under an atmosphere of $SiH_4$ or $Si_2H_6$ gas.

3. The method as claimed in claim 1, wherein the thickness of said lower electrode of the capacitor is larger than the diameter of said holes.

4. The method as claimed in claim 1, wherein the insulating layer is a nitride layer and a lower oxide layer.

* * * * *